United States Patent
Gonzalez et al.

(12) 
(10) Patent No.: US 6,504,211 B1
(45) Date of Patent: *Jan. 7, 2003

(54) CIRCUIT FOR DEVICE ISOLATION

(75) Inventors: Fernando Gonzalez, Boise, ID (US); David Y. Kao, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/053,352

(22) Filed: Apr. 1, 1998

Related U.S. Application Data

(63) Continuation of application No. 08/639,903, filed on Apr. 19, 1996, now Pat. No. 5,763,916.

(51) Int. Cl.⁷ .............................................. H01L 27/01
(52) U.S. Cl. ....................... 257/345; 257/344; 257/373; 257/408
(58) Field of Search .............................. 257/327, 335, 257/344, 345, 373, 408

(56) References Cited

U.S. PATENT DOCUMENTS

| | | | |
|---|---|---|---|
| 5,366,915 A | 11/1994 | Kodama | 438/302 |
| 5,426,326 A | 6/1995 | Ohyu et al. | 257/408 |
| 5,532,508 A | 7/1996 | Kaneko et al. | 257/336 |
| 5,672,533 A | 9/1997 | Arima et al. | 438/241 |
| 5,763,916 A * | 6/1998 | Gonzalez et al. | 257/345 |

* cited by examiner

Primary Examiner—Eddie Lee
Assistant Examiner—George C. Eckert, II
(74) Attorney, Agent, or Firm—Workman, Nydegger & Seeley

(57) ABSTRACT

A MOS gate and associated source/drain region structure providing three junction diodes between a source/drain contact area and the substrate, instead of the typical total of one, resulting in improved isolation of a source/drain contact area and a storage node which may be formed thereat. For fabricate the structure, a source/drain region is formed in a substrate having a space charge in the bulk or major part thereof, the source/drain region including: a first region having a space charge with a charge opposite that of a space charge in the major part of the substrate; a second region separated from the major part of the substrate by the first region and having a space charge with a charge opposite that of the space charge of the first region; and a third region separated from the first region and the major part of the substrate by the second region and having a space charge with a charge opposite that of the space charge of the second region. The first and second regions extend laterally under an associated gate. The third region extends laterally to the boundary of the region under the gate, and does not extend under the gate. The third region includes a portion of the surface of the substrate corresponding to a source/drain contact area. The source/drain region may be prepared by successive angled implants of alternating charge. A storage node may then be formed above the third region.

30 Claims, 3 Drawing Sheets

CIRCUIT FOR DEVICE ISOLATION

This is a continuation of U.S. patent application Ser. No. 08/639,903 filed on Apr. 19, 1996, now U.S. Pat. No. 5,763,916, which is incorporated herein by reference.

BACKGROUND OF THE INVENTION

1. The Field of the Invention

The present invention relates to the manufacture of semiconductor devices, especially to MOSFET and related devices, and to the structure and formation of source/drain regions in such devices. More particularly, the present invention relates to structures for improved isolation of source/drain regions, particularly useful to isolate storage nodes in a DRAM device, and to methods for forming the same.

2. The Relevant Technology

FIG. 1 shows a cross section of some elements of a typical MOSFET type device. A substrate 12 is typically lightly doped P type, having consequently a positive space charge in the bulk or major part thereof. A gate 14 is separated from substrate 12 by a gate oxide 16. Source/drain regions 18, 20 have been formed in substrate 12 by doping substrate 12 with N-type dopant(s), resulting in a negative space charge within source/drain regions 18, 20. A field oxide isolation region 22 isolates individual electrically active areas of substrate 12.

Certain of the electrical characteristics of a device such as that shown in FIG. 1, as employed in DRAM and similar applications, are illustrated in the circuit diagram of FIG. 2. A bit line 24 contacts one side of a transistor 28 corresponding to a source/drain region such as source/drain region 18 of FIG. 1, while a word line 26 contacts the gate of transistor 28 corresponding to a gate such as gate 14 of FIG. 1. At the other side of transistor 28 is located a storage node N corresponding to a second source/drain region such as source/drain region 20 of FIG. 1, where an electrical charge may be stored to or retrieved from a capacitor 30 connected thereto. A junction between semiconductor regions having opposite space charges acts as a junction diode 32 between storage node N and 2 ground, reducing current leakage from capacitor 30 through storage node N to ground. This junction diode corresponds to the junction between source/drain region 20 and substrate 12 in FIG. 1.

The junction between source/drain region 20 and substrate 12, like essentially every diode, inherently leaks current. In DRAM devices and similar applications, a charge stored at capacitor 30 is typically used to represent a 1-bit, and a lack of charge a 0-bit. The stored charge (or lack thereof) is refreshed at regular intervals. The leakage across junction diode 32 must be small enough so that a charge stored in a capacitor connected to source/drain region 20 will not dissipate between refresh cycles.

As miniaturization of integrated circuits increases, the capacitance of a cell capacitor in a DRAM circuit tends to decrease, making smaller leakage desirable to maintain adequate charge between refresh cycles. If leakage is sufficiently small, the time between refresh cycles can even be increased, resulting in faster responding DRAM with less power consumption. Thus it is desirable to decrease the leakage from a source/drain region to a substrate, particularly a source/drain region functioning as a storage node in a DRAM or similar device.

SUMMARY AND OBJECTS OF THE INVENTION

An object of the present invention is to provide a method of reducing current leakage from a source/drain region to an associated substrate.

A further object of the present invention is to provide a source/drain region structure having decreased leakage to a substrate.

Still a further object of the present invention is to provide a method of forming a source/drain region structure having decreased leakage to a substrate.

Still a further object of the present invention is to provide a cell structure for DRAM and similar devices allowing a lower frequency of refresh cycles.

In accordance with the present invention, a source/drain region is formed in a substrate, the source/drain region including: a first region having a space charge with a polarity opposite that of a space charge in the major part of the substrate; a second region separated from the major part of the substrate by the first region and having a space charge with a polarity opposite that of the space charge of the first region; and a third region separated from the first region and the major part of the substrate by the second region and having a space charge with a polarity opposite that of the space charge of the second region. The first and second regions extend laterally under an associated gate. The third region extends laterally to the boundary of the region under the gate, and does not extend under the gate. The third region includes a portion of the surface of the substrate corresponding to a source/drain contact area. The forgoing source/drain region structure provides three junction diodes between a source/drain contact area and the substrate, instead of the typical total of one.

Also in accordance with the present invention, the structure briefly described above may be formed by first implanting into a first region a first species, the implanting of the first species causing a space charge to arise in the first region opposite in polarity to a space charge in the major part of a substrate in which the source/drain region is formed. Second, a second species is implanted into a second region, the second region being enclosed from the major part of the substrate by the first region and extending under the gate of the associated gate stack. The implanting of the second species into the second region results in a space charge in the second region having a polarity opposite to the polarity of the space charge in the first region. Third, a third species is implanted into a third region, the third region extending to the source/drain contact area and enclosed from the first region and the major part of the substrate by the second region and extending laterally up to but preferably not significantly under the gate of the associated gate stack. The implanting of the third species into the third region results in the third region having a space charge opposite in polarity to the space charge in the second region.

The implanting of the first species and the implanting of the second species is preferably accomplished by an angled implant performed after the associated gate stack is formed, but before spacers are formed on the associated gate stack. The implanting of the third species is preferably performed by an angled implant after the formation of spacers enclosing the associated gate stack.

The above briefly described structure and method result in decreased current leakage from a source/drain contact area to substrate, allowing greater time between refresh cycles in a DRAM device in which the above structure and method are employed.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention introduces a new source/drain structure for use in MOSFET type devices and a method for producing the same. The basic elements of the inventive structure are shown in FIG. 3.

Figure 3:
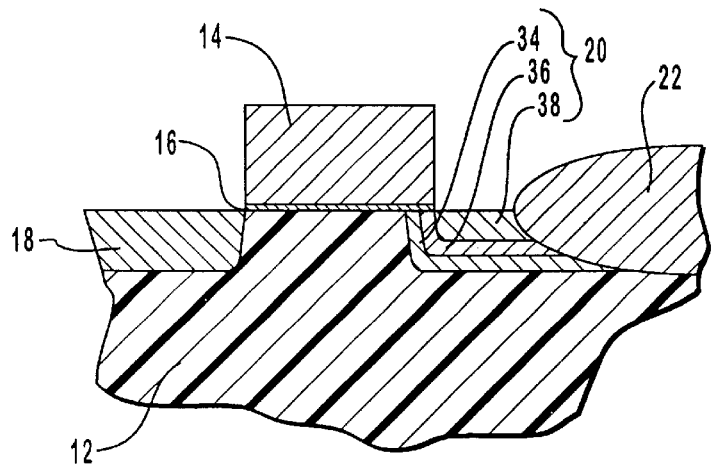
FIG. 3 is a partial cross section of a partially formed integrated circuit device of the present invention.

FIG. 3 is a cross section of some elements of a semiconductor device. A substrate 12 is lightly doped to produce a space charge therein, which space charge remains in the major portion or bulk of substrate 12. The space charge is typically of positive polarity, though it may also be negative. Substrate 12 has a gate 14 formed thereon and separated therefrom by a gate oxide 16. Laterally adjacent to gate 14 in substrate 12 has been formed a source/drain region 18. A field oxide isolation region 22 electrically isolates separate active areas in substrate 12. A source drain region 20 is laterally adjacent gate 14 opposite source/drain region 18.

Source/drain region 20 includes first, second, and third regions 34, 36, 38. First region 34 is doped so as to have a space charge therein opposite in polarity to that in substrate 12. Second region 36 is doped so as to have a space charge therein opposite in polarity to that in first region 34 and the same as that in substrate 12. Third region 38 is doped so as to have a space charge therein opposite in polarity to that in second region 36 and in substrate 12 and the same as that in first region 34.

Second region 36 is separated from the major part of substrate 12 by first region 34. Third region 38 is separated from first region 34 by second region 36. If the major portion of substrate 12 has a positive space charge, for example, then first and third regions 34, 38 have a negative space charge, and second region 36 has a positive space charge. This produces an N-P junction between third region 38 and second region 36, a P-N junction between second region 36 and first region 34, and another N-P junction between region 34 and substrate 12.

Figure 4:
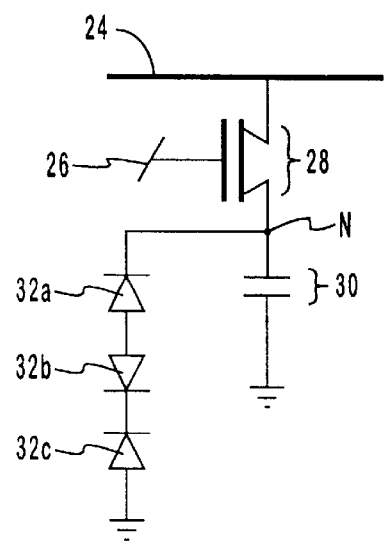
FIG. 4 is a circuit diagram of an application of the partial structure shown in FIG. 1 in a DRAM circuit.

Certain of the electrical characteristics of a device such as that shown in FIG. 3, when employed in DRAM and similar applications, are illustrated in the circuit diagram of FIG. 4. A bit line 24 contacts one side of a transistor 28, which side corresponds to a source/drain region such as source/drain region 18 of FIG. 3, while a word line 26 contacts the gate of transistor 28 corresponding to a gate such as gate 14 of FIG. 3. At the other side of transistor 28 is located a storage node N corresponding for example to the third region 38 of the source drain region 20 of FIG. 3, where an electrical charge may be stored to or retrieved from a capacitor 30 connected thereto. Junctions between semiconductor regions having opposite space charges such as junctions between first, second and third regions 34, 36, 38 of FIG. 3 act as a junction diodes 32a, 32b, 32c between storage node N and ground.

Figure 1:
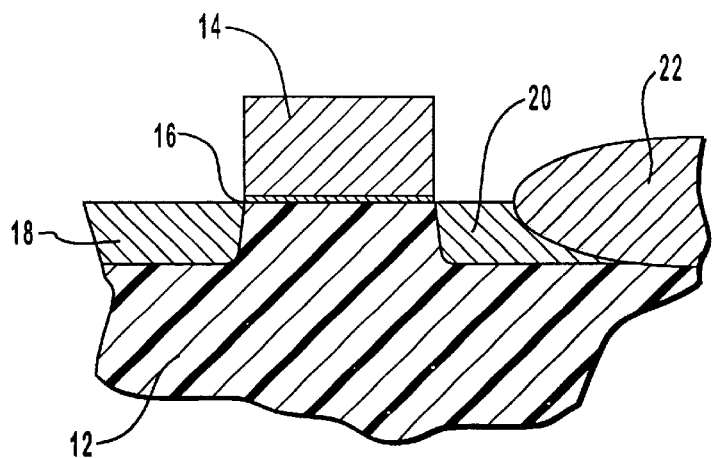
FIG. 1 is a partial cross section of a partially formed integrated circuit device of the prior art.
Figure 2:
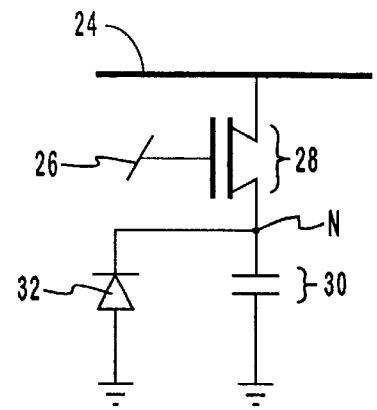
FIG. 2 is a circuit diagram of an application of the partial structure shown in FIG. 1 in a DRAM circuit.

Junction diodes 32a and 32c are reverse biased when storage node N holds a positive charge relative to a substrate. Junction diodes 32a and 32c thus help prevent current leakage from storage node N to the substrate. The presence of two reverse biased junction diodes between a stored positive charge and the substrate substantially decreases the current leakage compared to the prior art structure of FIG. 1, in which only one such diode is present.

Junction diode 32b is reverse biased when storage node N holds a negative charge relative to the substrate. Thus junction diode 32b helps prevent current leakage if a negative charge is stored at storage node N. Typical prior art structures have no junction diode corresponding to junction diode 32b, and thus cannot hold a negative charge for any significant length of time, so that a positive charge is used to represent one of two possible states, such as a binary "1", while an absence of charge or a low positive charge is used to represent the other of the two possible states, such as a binary "0". The structure of the present invention, by providing for storage of charges of both polarities, opens the possibility of using a positive charge to represent one of two possible states, and a negative charge to present the other. Use of opposite polarities should allow more robust and reliable state detection, with a resulting potential increase in time between refresh cycles. Alternatively, a three state device, with positive, negative, and zero charge representing the three states, may even be created.

In FIG. 3, the portion of the surface of substrate 12 that is included in third region 38 is immediately adjacent to the portion of the surface of substrate 12 under gate 14. Third region 38 may alternatively extend slightly under gate 14, but optimally the extent of underlap should be as small as possible. First and second regions 34, 36, each extend under gate 14.

When the area of substrate 12 under gate 14, i.e., the channel under gate 14, is desired to be conducting, the structure of FIG. 3 acts like a double transistor, with a short conductive region being formed in second region 36 under gate 14, and a longer conductive region being formed in the major part or bulk of substrate 12 from first region 34 to source/drain region 18 under gate 14. By having third region 38 extend laterally at least to a point immediately adjacent to the surface of substrate 12 under gate 14, an appropriate charge on gate 14 is able to reliably form the short conductive region in second region 36.

When the channel under gate 14 is desired to be non-conducting, it is preferable that gate 14 be reverse biased, i.e., that gate 14 be held negative for an N-channel device or positive for a P-channel device, to prevent unwanted conduction and to provide the lowest possible current leakage across the channel.

The structure of source/drain region 20 may optionally be formed on both sides of an associated gate, such that source/drain regions 18 and 20 of FIG. 3 would both be structured as is source/drain region 20. While this may be preferred for some applications such as three-state devices, it is not presently preferred for DRAM devices because the additional junction diodes do provide some additional resistance even with the associated gate turned on.

A presently preferred method for forming the structure of the present invention is illustrated in FIGS. 5–8.

Figure 5:
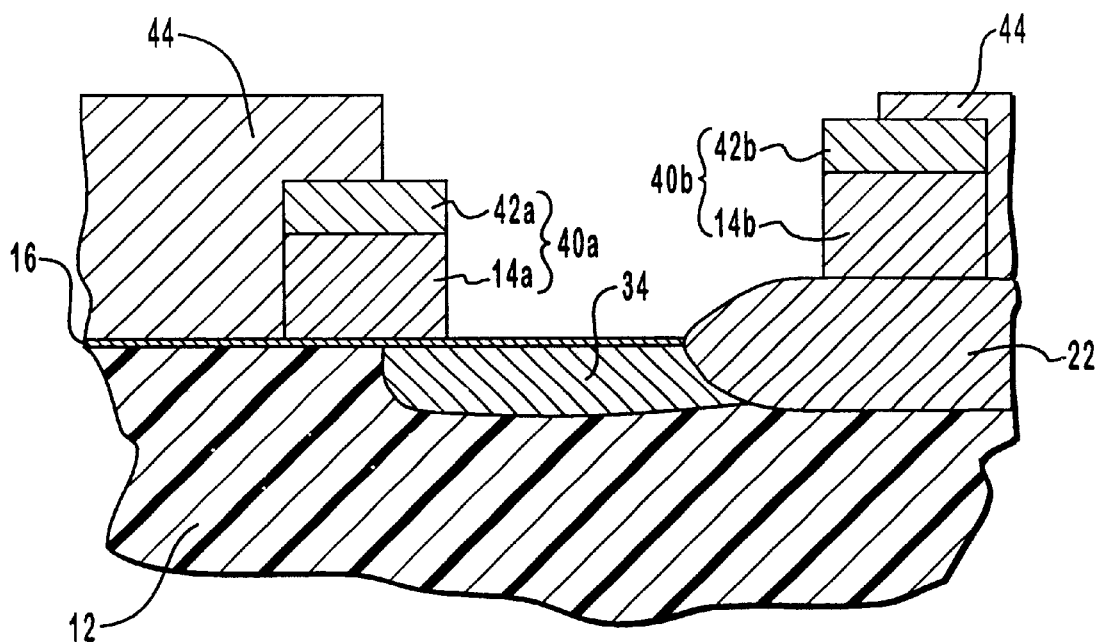
FIG. 5 is a partial cross section of a partially formed integrated circuit device in which the structure of the present invention is beginning to be formed.

FIG. 5 shows a cross section of a partially formed integrated circuit device. Substrate 12 has formed thereon gate oxide 16 and field oxide isolation region 22, on which in turn have been formed gate stacks 40a, 40b, including gates 14a, 14b, and dielectric layers 42a, 42b, respectively. A mask layer 44 has been deposited and patterned to leave exposed the surface of substrate 12 between gate stacks 40, which surface, at that part not under the isolation region 22, will become a source/drain contact area.

Assuming for example that substrate 12 is a P-type substrate, a first species in the form of an N-type dopant has then been implanted with an angled implant. The angled implant has resulted in a first region 34 as shown having a space charge opposite that of substrate 12. Alternatively, the energy level of the implant may be kept sufficiently tight that first region 34 is then shaped similarly to first region 34 in FIG. 3. In either case, the angle of the implant and energy of the implant have been chosen such that first region 34 underlaps gate 14a to a certain desired extent. The dosage level is preferably N-(N, lightly doped).

Figure 6:
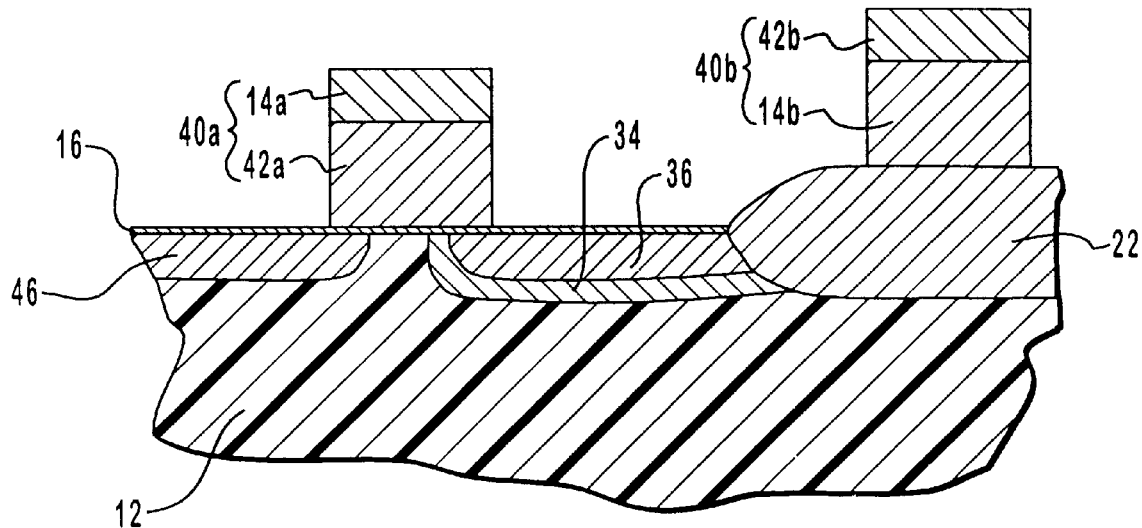
FIG. 6 is the cross section of FIG. 5 after some processing according to the present invention.

Next, mask layer 44 is removed, and a second species in the form of a P-type dopant is implanted with an angled implant. The angle and energy of the implant are chosen such that a resulting second region 36 also underlaps gate 14a, but not to as great an extent as first region 34, as shown in FIG. 6. Again, the energy of the implant may alternatively be sufficiently tight to produce a second region 36 more in the shape of second region 36 of FIG. 3. Either way, the dosage of the implant is such as to create a P-region in second region 36. A P-region 46 is also created at the opposite side of gate 14a by the angled implant of the second species as part of the preparation of a conventional state of the art source/drain region on that side.

Figure 7:
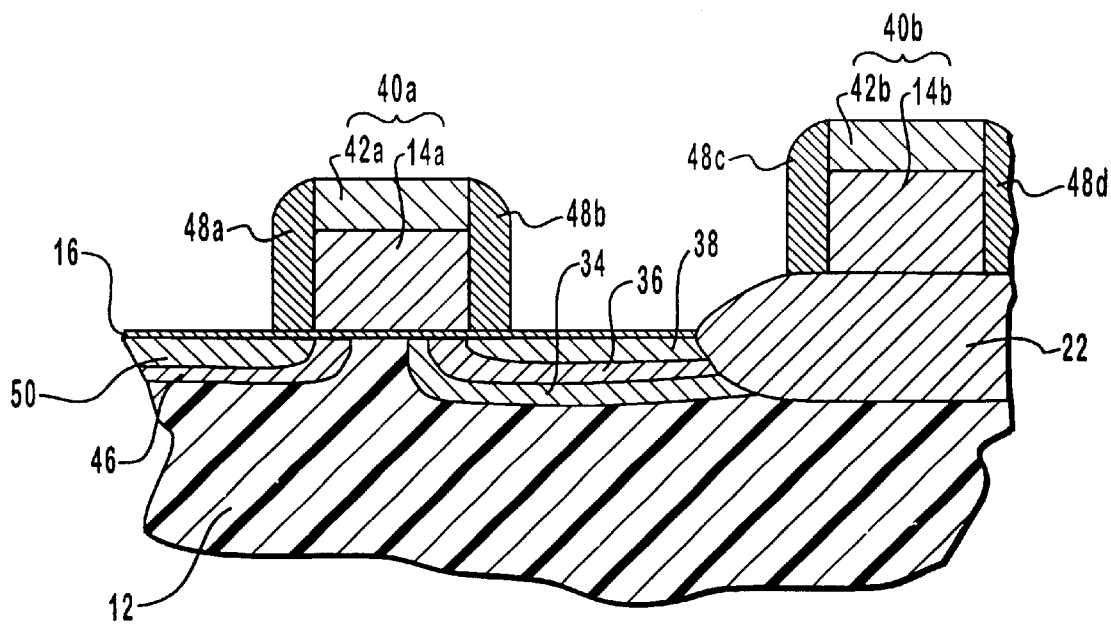
FIG. 7 is the cross section of FIG. 6 after further processing according to the present invention.

Spacers are then formed, laterally enclosing gate stacks 40a and 40b, and a third species in the form of an N-type dopant is implanted with an angled implant, the result of which is seen in FIG. 7. The first species may of course by identical to the first species. The angle and energy of the implant are chosen such that a resulting third region underlaps the spacer 48b on gate stack 40a, and so that the third region extends laterally up to but not under gate 14a. An N-doped region 50 results within P-region 46. At this point the inventive source/drain structure is essentially complete.

Figure 8:
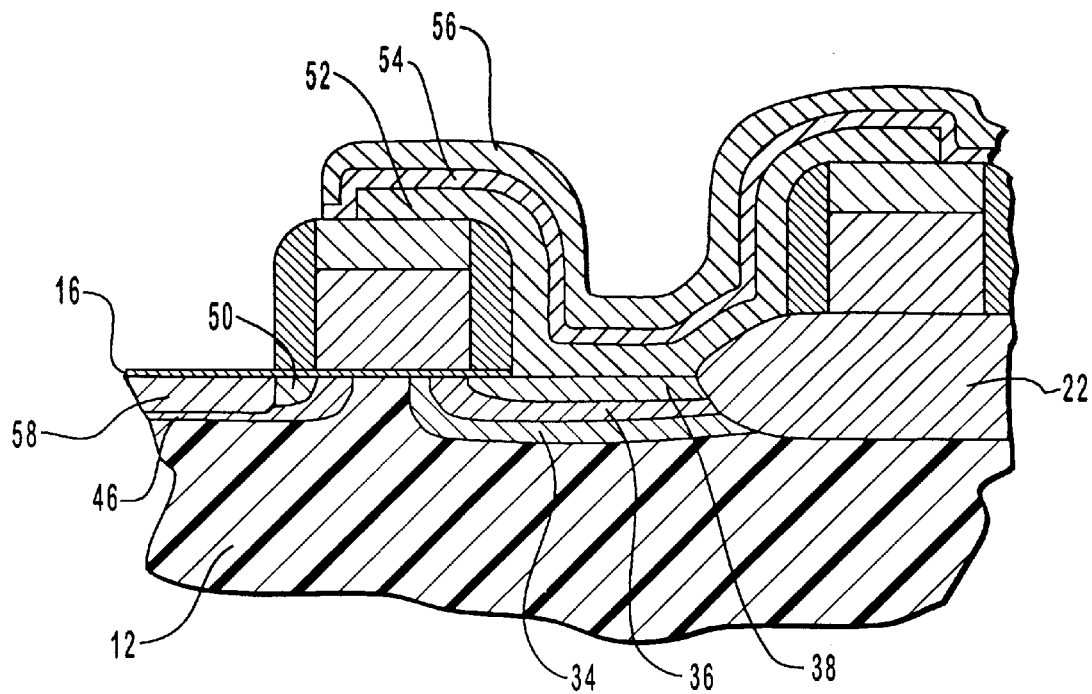
FIG. 8 is the cross section of FIG. 7 after further processing as currently most preferred for use with the present invention.

In the presently most preferred application of the present invention, a capacitor is next formed in electrical contact with third region 38 by removing gate oxide 16 from the uppermost surface of third region 38, then depositing and patterning in succession a conductive layer 52, a dielectric layer 54, and a conductive cell plate layer 56. With these layers in place, another implant of an N-type dopant is performed, at higher energy and less angle than the implant of the third species and with a dosage so as to create an N+ region 58 within N-doped region 50 and with the general shape as shown in FIG. 8. This last step essentially completes formation of a typical state of the art source drain region opposite the inventive source drain region from gate stack 40a.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A circuit comprising:
   a bit line;
   a word line;
   a capacitor;
   three diodes in series;
   a transistor having a gate, a first electrode, a second electrode, a first source/drain region, and a second source/drain region, wherein:
      the first and second source/drain regions are electrically isolated by the three diodes;
      the capacitor is in electrical contact with the first source/drain region;
      the second source/drain region is in electrical contact with the bit line.

2. The circuit as defined in claim 1, wherein the capacitor has a cell plate in electrical communication with ground and a storage node in electrical communication with the three diodes.

3. A circuit comprising:
   a bit line;
   a word line;
   a charge layer having a dielectric region therein;
   a first transistor formed upon the dielectric region;
   a second transistor having a gate, a first electrode, a second electrode, a first source/drain region, and a second source/drain region;
   a capacitor having a storage node making contact with the first transistor, the charge layer, and the second transistor;
   three diodes in series, wherein:
      the first and second source/drain regions of the second transistor are electrically isolated by the three diodes;
      the capacitor is in electrical contact with the first source/drain region of the second transistor; and
      the second source/drain region of the second transistor is in electrical contact with the bit line.

4. A circuit comprising:
   a bit line;
   a word line;
   a capacitor having a cell plate in electrical communication with ground and having a storage node;
   a transistor having a gate, a first electrode, a second electrode, and a source/drain region, wherein:
      the first electrode is in electrical communication with said source/drain region;
      the source/drain region is in electrical communication with the bit line;
      the gate is in electrical communication with the word line;
      the second electrode and the storage node are in electrical communication with a first diode;
      the first diode is in series with a second diode that is reversed biased to the first diode;
      the second diode is in series to a third diode that is reversed biased to the second diode; and
      the third diode is in electrical communication with ground.

5. A circuit comprising:
a bit line;
a word line;
a charge layer having a dielectric region therein;
a first transistor formed upon the dielectric region;
a second transistor having a gate, a first electrode, a second electrode, a first source/drain region, and a second source/drain region;
a capacitor having cell plate in electrical communication with ground and a storage node making contact with the first transistor, the charge layer, and the second transistor, wherein:
the first electrode of the second transistor is in electrical communication with said source/drain region of the second transistor;
the source/drain region of the second transistor is in electrical communication with the bit line;
the gate of the second transistor is in electrical communication with the word line;
the second electrode of the second transistor and the storage node are in electrical communication with a first diode;
the first diode is in series with a second diode that is reversed biased to the first diode;
the second diode is in series to a third diode that is reversed biased to the second diode; and
the third diode is in electrical communication with ground.

6. A circuit comprising:
a charge layer with a first part thereof having a space charge of a given charge, said charge layer having a surface;
a gate stack on said surface of said charge layer; and
a first source/drain contact area on said surface of said charge layer adjacent said gate stack, said first source/drain contact area being electrically isolated from the first part of said charge layer by three junction diodes in series.

7. The circuit as defined in claim 6, wherein said three junction diodes include, in order from said first source/drain contact area to the first part of said charge layer, a first N-P junction diode, a P-N junction diode, and a second N-P junction diode.

8. The circuit as defined in claim 6, wherein said three junction diodes include, in order from said first source/drain contact area to the first part of said charge layer, a first P-N junction diode, an N-P junction diode, and a second P-N junction diode.

9. The circuit as defined in claim 6 further comprising a capacitor in electrical contact with said first source/drain contact area.

10. The circuit as defined in claim 9, further comprising a second source/drain contact area on said surface of said charge layer adjacent said gate stack and opposite said first source/drain contact area, said second source/drain contact area in electrical contact with a bit line.

11. The circuit as defined in claim 6, further comprising a second source/drain contact area on said surface of said charge layer adjacent said gate stack and opposite said first source/drain contact area, said second source/drain contact area being isolated from the first part of said charge layer by three junction diodes in series.

12. The circuit as defined in claim 6, further comprising a capacitor in electrical contact with said first source/drain contact area, and a second source/drain contact area on said surface of said charge layer adjacent said gate stack and opposite said first source/drain contact area, said second source/drain contact area being isolated from the first part of said charge layer by three junction diodes in series.

13. A circuit comprising:
a charge layer with a first part thereof having a space charge of a given charge, said charge layer having a surface;
a gate stack on said surface of said charge layer;
a first source/drain contact area on said surface of said charge layer adjacent said gate stack, said first source/drain contact area being isolated from the first part of said charge layer by a first set of three junction diodes;
a capacitor in electrical contact with said first source/drain contact area; and
a second source/drain contact area on said surface of said charge layer adjacent said gate stack and opposite said first source/drain contact area, said second source/drain contact area being in electrical contact with a bit line, and said second source/drain contact area being isolated from the first part of said charge layer by a second set of three junction diodes.

14. The circuit as defined in claim 13, wherein the first set of three junction diodes are formed in series and include, in order from said first source/drain contact area to the first part of said charge layer, a first N-P junction diode, a P-N junction diode, and a second N-P junction diode.

15. The circuit as defined in claim 13, wherein the first set of three junction diodes are formed in series and include, in order from said first source/drain contact area to the first part of said charge layer, a first P-N junction diode, an N-P junction diode, and a second P-N junction diode.

16. The circuit as defined in claim 13, wherein the second set of three junction diodes are formed in series and include, in order from said first source/drain contact area to the first part of said charge layer, a first N-P junction diode, a P-N junction diode, and a second N-P junction diode.

17. The circuit as defined in claim 13, wherein the second set of three junction diodes are formed in series and include, in order from said first source/drain contact area to the first part of said charge layer, a first P-N junction diode, an N-P junction diode, and a second P-N junction diode.

18. A circuit comprising:
an electrical device;
a charge layer with a first part thereof having a space charge of a first polarity, said charge layer having a surface;
a first region in said charge layer having a space charge of a second polarity opposite to the first polarity;
a second region in said charge layer having a space charge of the first polarity, said second region being isolated from contact with the first part of said charge layer by said first region; and
a third region in said charge layer having a space charge of the second polarity, said third region being isolated from contact with said first region by said second region and being in electrical communication with said electrical device.

19. The circuit as defined in claim 18, said first charge being positive.

20. The circuit as defined in claim 18, said first charge being negative.

21. The circuit as defined in claim 18, wherein an included portion of said surface of said charge layer is included in said third region.

22. The circuit as defined in claim 18, wherein:

the electrical device is a MOS transistor situated upon the charge layer;

said second region includes a portion of said surface of said charge layer underlying said MOS transistor; and said first region also includes a portion of said surface of said charge layer underlying said MOS transistor.

23. The circuit as defined in claim 22, further comprising a capacitor in electrical contact with said included portion of said surface of said charge layer.

24. A circuit device comprising:

an electrical device;

a charge layer with a first part thereof having a space charge of a first charge, said charge layer having a surface;

a first region in said charge layer having a space charge of a second charge opposite to the first charge;

a second region in said charge layer having a space charge of the first charge, said second region separated from the first part of said charge layer by said first region;

a third region in said charge layer having a space charge of the second charge, said third region separated from said first region by said second region, an included portion of said surface of said charge layer being included in said third region and immediately adjacent to the electrical device;

a fourth region in said charge layer opposite said gate of said first region and having a space charge of the first charge;

a fifth region in said charge layer having a space charge of the second charge, said fifth region separated from the first part of said charge layer by said fourth region; and a sixth region in said charge layer having a space charge of the second charge, said sixth region separated from the first part of said charge layer by said fourth region, a second included portion of said surface of said charge layer being included in fourth region and being in electrical communication with said electrical device.

25. The circuit as defined in claim 24, further comprising a capacitor in electrical contact with said included portion of said surface of said charge layer.

26. A circuit comprising:

a charge layer having a space charge of a first polarity, said charge layer having a surface;

an electrical device situated upon a portion of said surface of said charge layer;

a first region in said charge layer having a space charge of a second polarity opposite to the first polarity;

a second region in said charge layer having a space charge of the first polarity and being in contact with said first region; and a third region in said charge layer having a space charge of the second polarity and being in contact with the second region;

wherein:

said first, second, and third regions are in contact with said surface of said charge layer;

said electrical device has a side wall that defines a plane that is substantially perpendicular to said surface of said charge layer and extends into said charge layer to intersect said first, second, and third regions; and as the plane progressively extends into the charge layer, the plane first intersects the third region, then the second region, then the first region, and then enters a portion of said charge layer that is outside of said first, second, and third regions.

27. The circuit as defined in claim 26, wherein as the plane progressively penetrates into the charge layer, the plane first intersects an N-doped region, then a P-doped region, then an N-doped third region, then a P-doped region.

28. A circuit comprising:

a charge layer having a surface;

an electrical device having a first side opposite a second side, the electrical device being situated upon said charge layer;

first, second, and third regions in said charge layer on the first side of said electrical device;

fourth, fifth and sixth regions in said charge layer on the second side of said electrical device; and wherein:

the first and fourth regions each have a space charge of the same polarity;

the second and fifth regions each have a space charge of the same polarity;

the third and sixth regions each have a space charge of the same polarity;

the second region is in contact with the first and third regions;

the fifth region is in contact with the fourth and sixth regions;

the second region has a first side opposite a second side, and the first region is in contact with the first side of the second region and the third region is in contact with the second side of the second region; and the fifth region has a first side opposite a second side, and the fourth region is in contact with the first side of the fifth region and the sixth region is in contact with the second side of the fifth region.

29. A circuit comprising:

a charge layer having a surface;

an electrical device extending along a portion of said surface of said charge layer;

first and second electrically active regions in said charge layer on opposing sides of said electrical device;

a portion of said charge layer extending in between said first and second electrically active regions and in contact with said surface of said charge layer;

a dielectric region in the charge layer in spaced relation to the electrical device and in contact with the surface of the charge layer, wherein the surface of the charge layer in contact with said channel has at least three changes in the charge polarity thereof.

30. A circuit comprising:

a charge layer having a surface;

an electrical device extending along a portion of said surface of said charge layer, the electrical device having a side wall that defines a plane that is substantially perpendicular to said surface of said charge layer and extends into said charge layer;

first and second electrically active regions in said charge layer on opposing side of said electrical device;

a portion of said charge layer extending in between said first and second electrically active regions and in contact with said surface of said charge layer;

a dielectric region in the charge layer in spaced relation to the electrical device and in contact with the surface of the charge layer, wherein there are at least three changes in the charge polarity as the plane progressively extends into the charge layer.

* * * * *

UNITED STATES PATENT AND TRADEMARK OFFICE
CERTIFICATE OF CORRECTION

PATENT NO. : 6,504,211 B1
DATED : January 7, 2003
INVENTOR(S) : Fernando Gonzalez and David Y. Kao It is certified that error appears in the above-identified patent and that said Letters Patent is hereby corrected as shown below:

Column 1,
Line 39, delete "2"

Column 5,
Line 45, change "by" to -- be --

Column 6,
Line 20, after "region;" insert -- and --

Column 7,
Line 9, after "having" insert -- a --

Column 9,
Line 38, before "fourth" insert -- said --

Column 10,
Line 47, change "channel" to -- dielectric region --
Line 57, change "side" to -- sides --

Signed and Sealed this

Twenty-second Day of July, 2003

JAMES E. ROGAN
*Director of the United States Patent and Trademark Office*